(12) United States Patent
Vellianitis (10) Patent No.: US 8,119,494 B1
(45) Date of Patent: Feb. 21, 2012

(54) DEFECT-FREE HETERO-EPITAXY OF LATTICE MISMATCHED SEMICONDUCTORS

(75) Inventor: Georgios Vellianitis, Heverlee (BE)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 29 days.

(21) Appl. No.: 12/846,307

(22) Filed: Jul. 29, 2010

(51) Int. Cl.
*H01L 21/76* (2006.01)
*H01L 21/36* (2006.01)
(52) U.S. Cl. .................. 438/413; 438/481; 257/E21.102
(58) Field of Classification Search .................. 438/413, 438/481; 257/E21.102
See application file for complete search history.

(56) References Cited

U.S. PATENT DOCUMENTS

| 2004/0157412 | A1* | 8/2004 | Seifert | 438/478 |
| 2006/0281322 | A1* | 12/2006 | Brabant et al. | 438/706 |
| 2007/0267722 | A1* | 11/2007 | Lochtefeld et al. | 257/618 |
| 2009/0065047 | A1* | 3/2009 | Fiorenza et al. | 136/255 |

OTHER PUBLICATIONS

"High quality Ge on Si by epitaxial necking", "T. A. Langdo" et al., Applied Physics Letters, vol. 76, No. 25, Jun. 19, 2000.*
Park, J.-S. et al., "Defect reduction of selective Ge epitaxy in trenches on Si(001) substrates using aspect ratio trapping," Applied Physics Letters 90, 052113, 2007, American Institute of Physics, 3 pgs.

* cited by examiner

*Primary Examiner* — Kevin Parendo
(74) *Attorney, Agent, or Firm* — Slater & Matsil, L.L.P.

(57) ABSTRACT

A method includes providing a semiconductor substrate formed of a first semiconductor material; and forming a plurality of insulation regions over at least a portion of the semiconductor substrate, with a plurality of trenches separating the plurality of insulation regions apart from each other. A first epitaxial growth is performed to epitaxially grow a plurality of semiconductor regions in the plurality of trenches, wherein (111) facets are formed and exposed during the step of the first epitaxial growth. When the (111) facets of neighboring ones of the plurality of semiconductor regions touch each other, a second epitaxial growth is performed to continue grow the plurality of semiconductor regions to form (100) planes between the neighboring ones of the plurality of semiconductor regions.

20 Claims, 7 Drawing Sheets

DEFECT-FREE HETERO-EPITAXY OF LATTICE MISMATCHED SEMICONDUCTORS

TECHNICAL FIELD

This disclosure relates generally to integrated circuit devices, and more particularly to the formation of lattice mismatched semiconductors on semiconductor substrates.

BACKGROUND

The speeds of metal-oxide-semiconductor (MOS) transistors are closely related to the drive currents of the MOS transistors, which drive currents are further closely related to the mobility of charges. For example, NMOS transistors have high drive currents when the electron mobility in their channel regions is high, while PMOS transistors have high drive currents when the hole mobility in their channel regions is high.

Germanium is a commonly known semiconductor material. The electron mobility and hole mobility of germanium are greater than that of silicon, which is the mostly commonly used semiconductor material in the formation of integrated circuits. Hence, germanium is an excellent material for forming integrated circuits. However, in the past, silicon gained more popularity over germanium since its oxide (silicon oxide) is readily usable in the gate dielectric of MOS transistors. The gate dielectrics of the MOS transistors can be conveniently formed by thermal oxidation of silicon substrates. The oxide of germanium, on the other hand, is soluble in water, and hence is not suitable for the formation of gate dielectrics.

With the use of high-k dielectric materials in the gate dielectrics of MOS transistors, however, the convenience provided by the silicon oxide is no longer a big advantage, and hence germanium is reexamined for the use in integrated circuits.

In addition to germanium, compound semiconductor materials of group III and group V elements (referred to as III-V compound semiconductor hereinafter) are also good candidates for forming NMOS devices for their high electron mobility.

One of the most well-known methods of forming large active areas of non-silicon semiconductors, including III-V compound semiconductors and germanium, is depositing non-silicon semiconductors inside oxide trenches using an epitaxy method referred to as aspect trap ratio method. The aspect ratio of the trenches is great enough so that threading dislocations are blocked by the sidewalls of the oxides. However, the defect density of the resulting non-silicon semiconductors is still not low enough, particularly for the semiconductor material grown from wide trenches. On the other hand, if the deposition is performed starting from narrow trenches, although considerably low defect density may be achieved, the resulting dimensions of active areas are not big enough for device fabrication.

SUMMARY

In accordance with one aspect, a method includes providing a semiconductor substrate formed of a first semiconductor material; and forming a plurality of insulation regions over at least a portion of the semiconductor substrate, with a plurality of trenches separating the plurality of insulation regions apart from each other. A first epitaxial growth is performed to epitaxially grow a plurality of semiconductor regions in the plurality of trenches, wherein (111) facets are formed and exposed during the step of the first epitaxial growth. When the (111) facets of neighboring ones of the plurality of semiconductor regions touch each other, a second epitaxial growth is performed to continue grow the plurality of semiconductor regions to form (100) planes between the neighboring ones of the plurality of semiconductor regions.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1A through 8B are cross-sectional views and a top view of intermediate stages in the formation of a block semiconductor region in accordance with various embodiments.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

Novel methods of epitaxially growing low-defect semiconductor materials are presented. The intermediate stages of manufacturing a block semiconductor layer in accordance with an embodiment are illustrated. The variations of the embodiment are discussed. Throughout the various views and illustrative embodiments, like reference numbers are used to designate like elements.

Figure 1A:
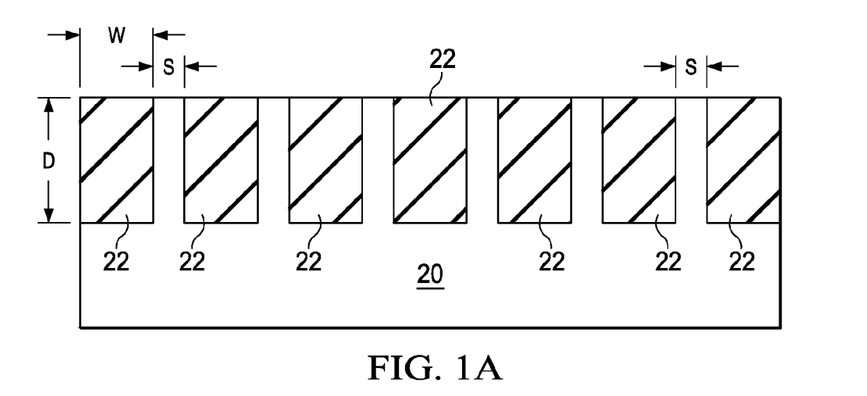
Figure 4A:
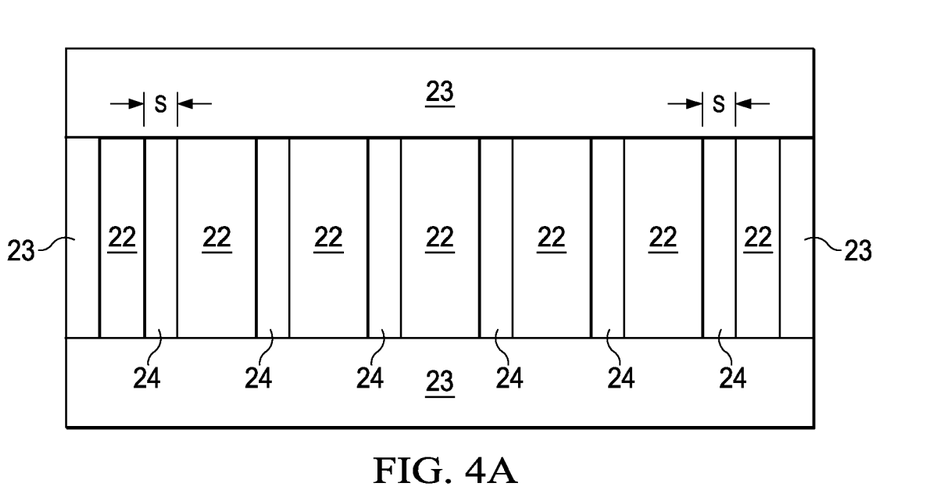

Referring to FIG. 1A, substrate 20 is provided. Substrate 20 may be a semiconductor substrate formed of a commonly used semiconductor material such as silicon. Insulation regions such as shallow trench isolation (STI) regions 22 are formed in substrate 20. Depth D of insulation regions 22 may be between about 50 nm and about 300 nm, or even between about 100 nm and about 400 nm. Width W of insulation regions 22 may be between about 5 nm and about 50 nm. It is realized, however, that the dimensions recited throughout the description are merely examples, and may be changed if different formation technologies are used. Insulation regions 22 may be formed by recessing semiconductor substrate 20 to form openings (not shown), and then filling the openings with dielectric materials. In an embodiment, Insulation regions 22 include a plurality of strips (FIG. 4), which are parallel to each other, and may have uniform spacings S from each other, although spacings S may also be different from each other. In an exemplary embodiment, spacings S between insulation regions 22 are between about 10 nm and about 100 nm.

Figure 2A:
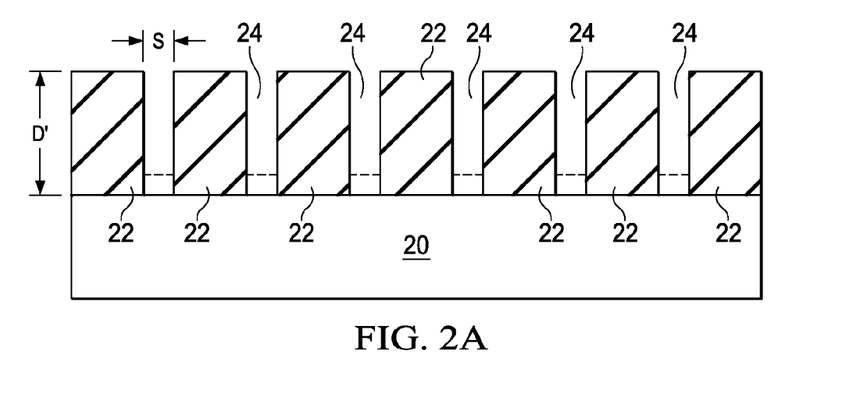

Referring to FIG. 2A, the portions of substrate 20 between insulation regions 22 are etched, forming trenches 24. In an embodiment, the bottoms of trenches 24 are level with the bottoms of insulation regions 22. In alternative embodiments, the bottoms of trenches 24 (as shown by dotted lines) are higher than the bottoms of insulation regions 22. Accordingly, the aspect ratios (the ratios of depth D' of trenches 24 to widths S, which are also the spacing between neighboring STI regions) of trenches 24 may be adjusted to desirable values.

Figure 3:
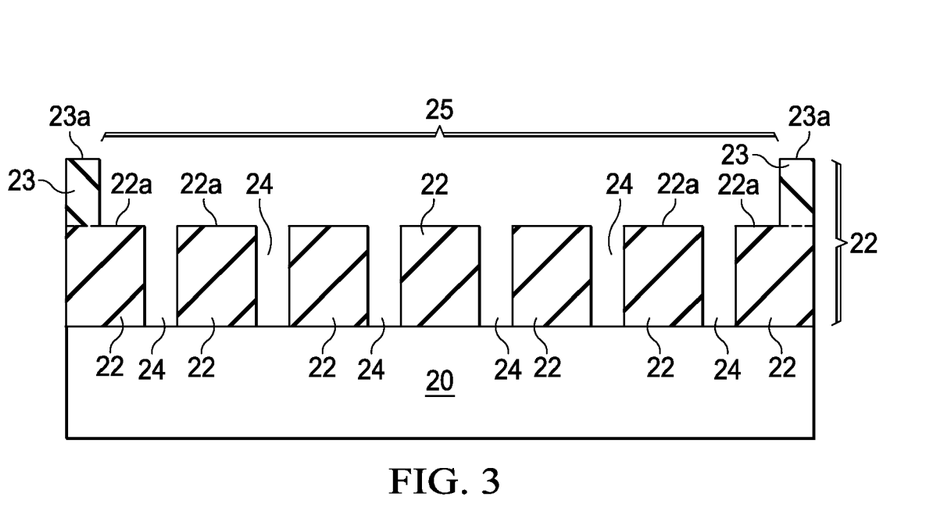
Figure 4B:
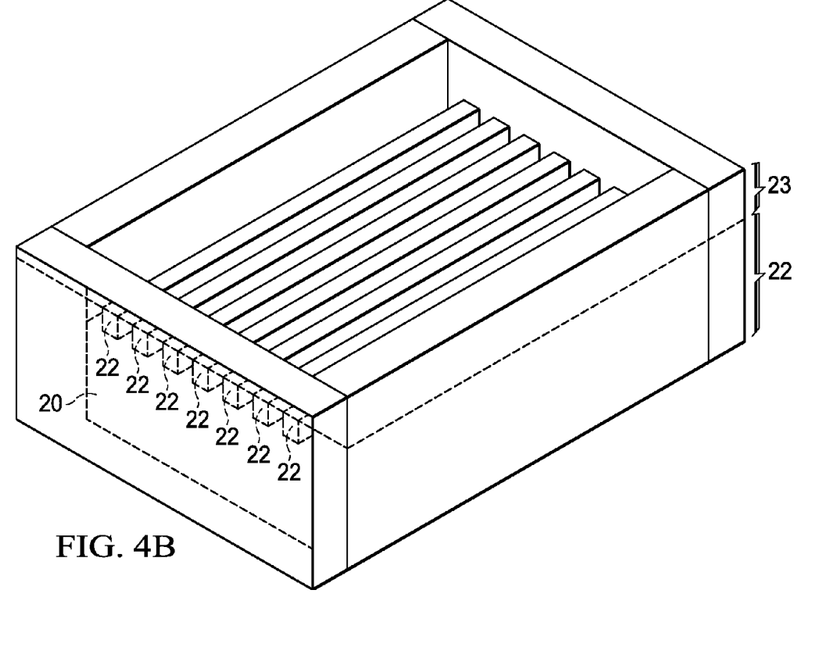

In an embodiment, insulation regions 22 and trenches 24 are distributed throughout the entire chip and/or the entire respective wafer, with a substantially uniform pattern density of insulation regions 22, and/or a substantially uniform pattern density of trenches 24. In alternative embodiments, as shown in FIG. 3, the top surfaces of first portions of insulation regions 22 (in the illustrated region 25) are further lowered by etching, and the resulting top surfaces of the first portions of insulation regions 22 in region 25 are referred to as 22a. On the other hand, second portions of insulation regions 22 are not etched. Throughout the description, the region encircled by the second portions of insulation regions 22 is referred to as region 25, and the portions of insulation regions 22 higher than top surfaces 22a are referred to as insulation regions 23. Region 25 thus include regions directly over insulation regions 22 and region directly over trenches 24. The top surfaces of the second portions of insulation regions 22 are referred to as 23a hereinafter. FIGS. 4A and 4B illustrate a top view and a perspective view, respectively, of the structure as shown in FIG. 3. It is observed that insulation regions 23 may form a circle, which may have a rectangular shape, encircling region 25.

Figure 1B:
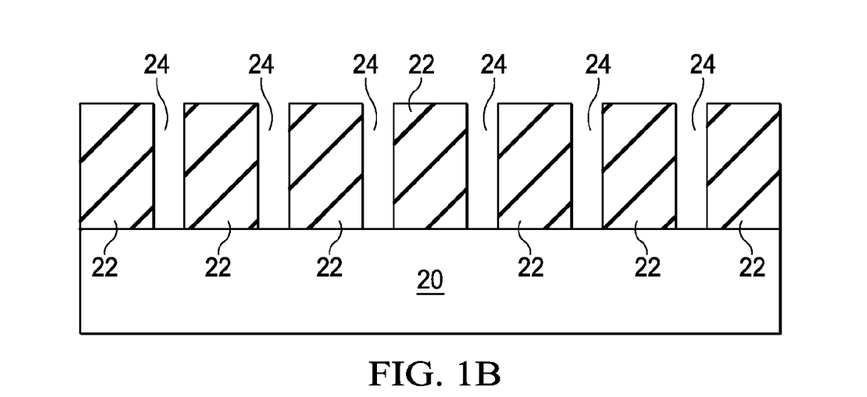
Figure 2B:
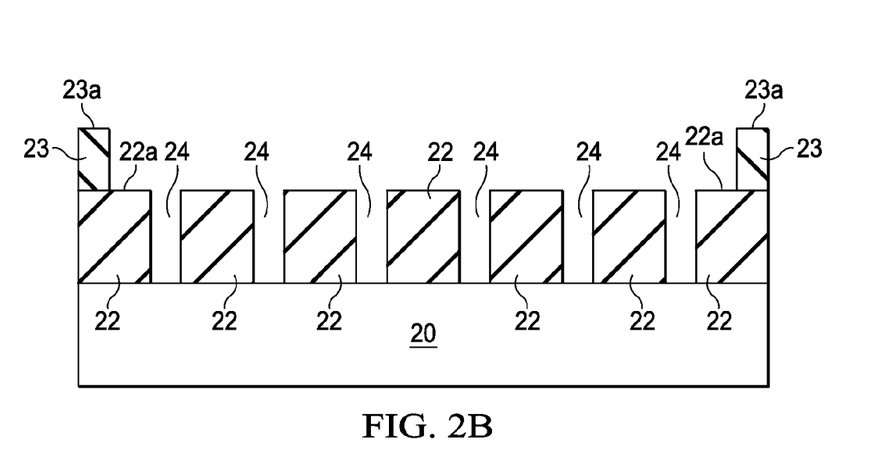

FIGS. 1B and 2B illustrate an alternative embodiment for forming trenches 24 and insulation regions 22. Referring to FIG. 1B, substrate 20 is provided, and insulation regions 22 are formed on the top of substrate 20. The spacings between insulation regions 22 thus form trenches 24. The formation methods may include a deposition method such as plasma enhance chemical vapor deposition (PECVD), although other applicable methods may be used. Insulation regions 22 may be formed of silicon oxide, silicon nitride, silicon oxynitride, or the like. Next, as shown in FIG. 2B, insulation regions 23 are formed on top of insulation regions 22. Again, the top surfaces of insulation regions 22 are denoted as 22a, while the top surfaces of insulation regions 23 are denoted as 23a. The top view and the perspective view of the structure shown in FIG. 2B may be essentially the same as shown in FIGS. 4A and 4B, respectively.

Figure 5:
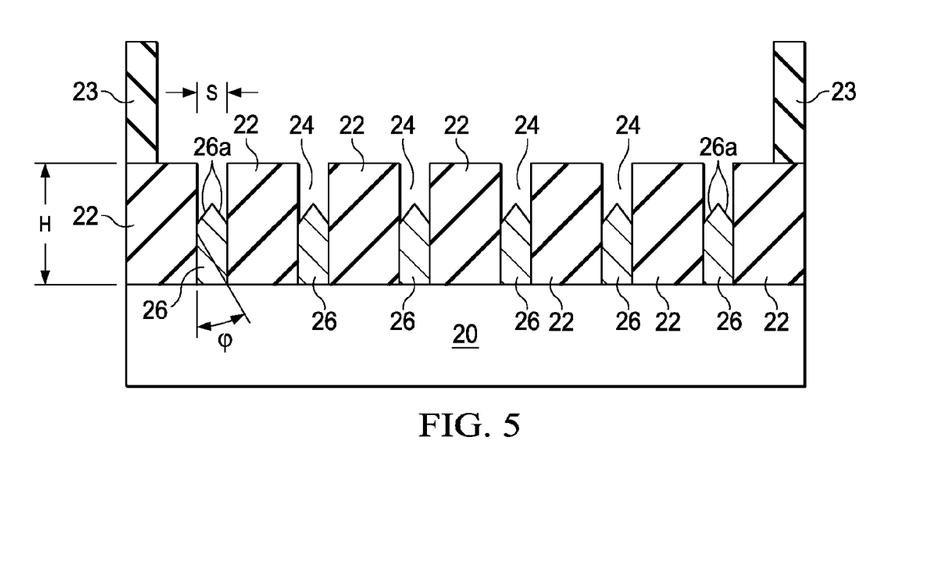

Referring to FIG. 5, semiconductor regions 26, which comprise a material having a lattice constant different from that of semiconductor substrate 20, are epitaxially grown in trenches 24. Throughout the description, the epitaxial growth is referred to as the first epitaxy growth step. The methods for forming semiconductor regions 26 include, for example, selective epitaxial growth (SEG), which may include one of the chemical vapor deposition (CVD) methods. In an embodiment, semiconductor regions 26 comprise silicon germanium, which may be expressed as $Si_{1-x}Ge_x$, wherein x is the atomic percentage of germanium in silicon germanium, and may be greater than 0 and equal to or less than 1. When x is equal to 1, semiconductor regions 26 are formed of pure germanium. In alternative embodiments, semiconductor regions 26 comprise a compound semiconductor material comprising group III and group V elements (and the respective semiconductor material is referred to as a III-V compound semiconductor), which may include, but is not limited to, GaAs, InP, GaN, InGaAs, InAlAs, GaSb, AlSb, AlAs, AlP, GaP, and combinations thereof. The process gases are thus selected according to the desirable composition in semiconductor regions 26. In an exemplary embodiment wherein pure germanium is formed as semiconductor regions 26, $GeH_4$ (germane) is used, and $H_2$ (hydrogen) may be used as a carrier gas. In the following presented embodiments, the formation of pure germanium is used as an example to explain the concept of the present disclosure.

The process conditions for forming semiconductor regions 26 are adjusted so that (111) facets 26a are formed. This may be achieved, for example, by increasing the growth temperature and reducing the partial pressure of germane. In an embodiment, the growth temperature is between about 500° C. and about 650° C. Depending on the widths S of trenches 24, the growth temperature has an upper limit in order to avoid Ge from migrating during the epitaxial growth, and greater widths S may be accompanied by higher growth temperatures. In an exemplary embodiment wherein the widths S of trenches 24 are less than about 25 nm, the growth temperature may be between about 500° C. and about 600° C.

The partial pressure of germane may be as low as possible to allow the formation of high quality (111) facets 26a, wherein the partial pressure of germane may be lower than about 0.13 torrs. This may be achieved by increasing the carrier gas (such as hydrogen) flow, reducing germane flow, and/or decreasing the total pressure in the growth chamber, in which semiconductor regions 26 are grown. The partial pressure of germane and the total pressure in the chamber has the relationship:

$$P(GeH_4)=F(GeH_4)*P_{tot}/(F(H_2)+F(GeH_4)) \qquad [Eq.\ 1]$$

Wherein $P(GeH_4)$ and $P_{tot}$ are the partial pressure of germane and the total pressure, respectively, and $F(GeH_4)$ and $F(H_2)$ are the flow rates of germane and hydrogen, respectively. Accordingly, reducing the total pressure $P_{tot}$ may also result in the reduction of the partial pressure of germane. In an exemplary embodiment, the total pressure in the chamber is lower than about 80 torrs, although it may be increased to up to the atmospheric pressure (760 torrs), providing the partial pressure of germane is low. In an embodiment, the hydrogen flow is about 50 slm to about 100 slm, while the pure germane flow is between about 2.5 sccm and about 10 sccm.

The threading dislocations are trapped inside trenches 24, so that when semiconductor regions 26 are grown increasingly higher, more and more threading dislocations are blocked by sidewalls of insulation regions 22. When semiconductor regions 26 are grown to the tops of trenches 24, the threading dislocations are substantially eliminated/blocked by insulation regions 22. In the meantime, the top surfaces of semiconductor regions 26 may be formed of substantially pure (111) facets. To achieve a fault-free growth, the aspect ratio AR (H/S) of trenches 24 needs to be high. In an embodiment, height H and width S of trenches 24 may have the relationship H>tan(60°)*S, which is H>1.73S (which meaning that aspect ratio AR is greater than about 1.73), wherein 60° is an exemplary value of angle ϕ. Height H of trenches 24 may also be greater than about 2*tan(60°)*S, which is 3.46S (with aspect ratio AR being greater than about 3.46) to ensure the threading dislocations in subsequently formed epitaxial semiconductors are limited inside trenches 24.

Figure 6:
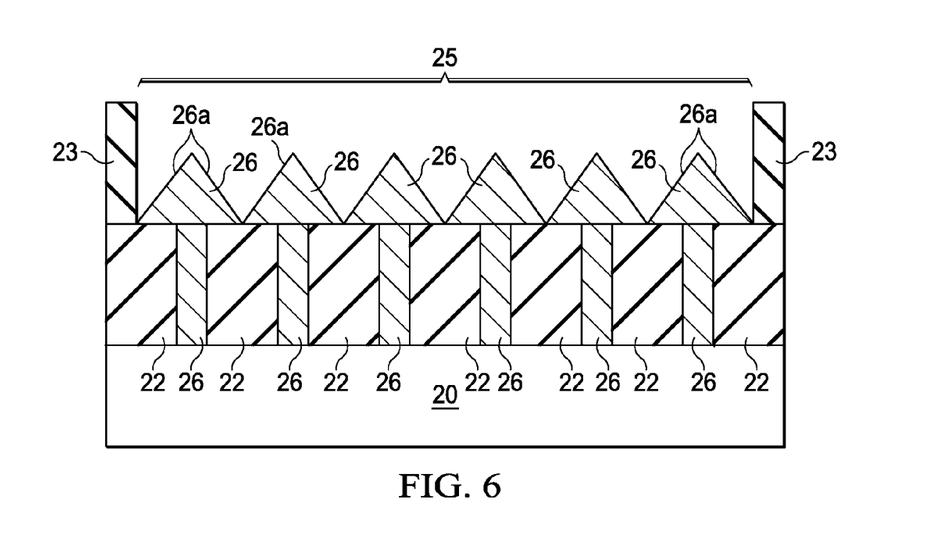

The process condition for forming high-quality (111) facets are maintained throughout the entirety of the epitaxial growth of semiconductor regions 26. The same process conditions may be maintained even after semiconductor regions 26 fully fill trenches 24. FIG. 6 illustrates a resulting structure. It is observed that semiconductor regions 26 grow laterally and vertically, with (111) facets 26a remaining expanding laterally and vertically. The growth is continued until neighboring (111) facets 26a touch each other, wherein the neighboring (111) facets 26a belong to semiconductor regions 26 grown starting from neighboring trenches 24. Since insulation regions 22 may have uniform spacings S, all semiconductor regions 26 may touch each other substantially simultaneously. Further, the semiconductor regions 26 close to the edges of region 25 may also touch and blocked by insulation regions 23.

Figure 7:
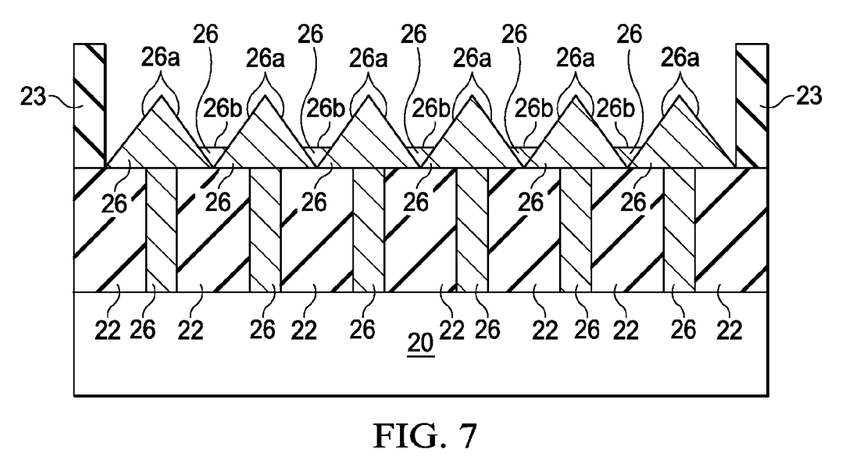
Figure 8A:
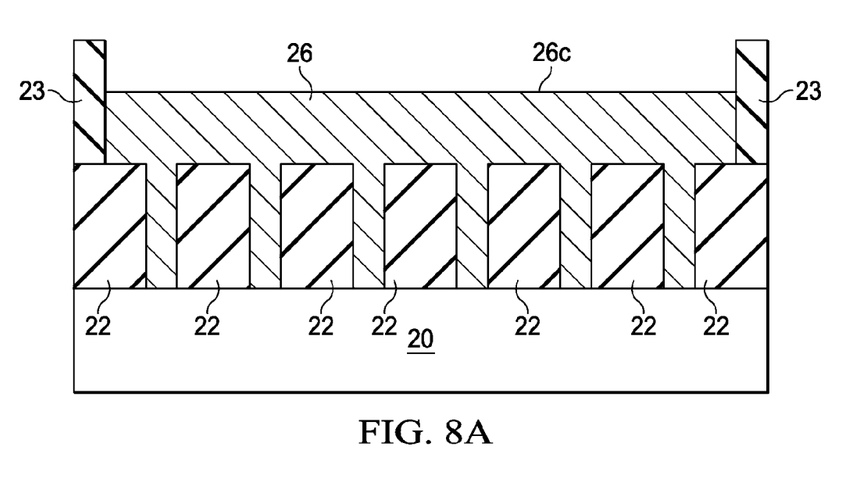
Figure 8B:
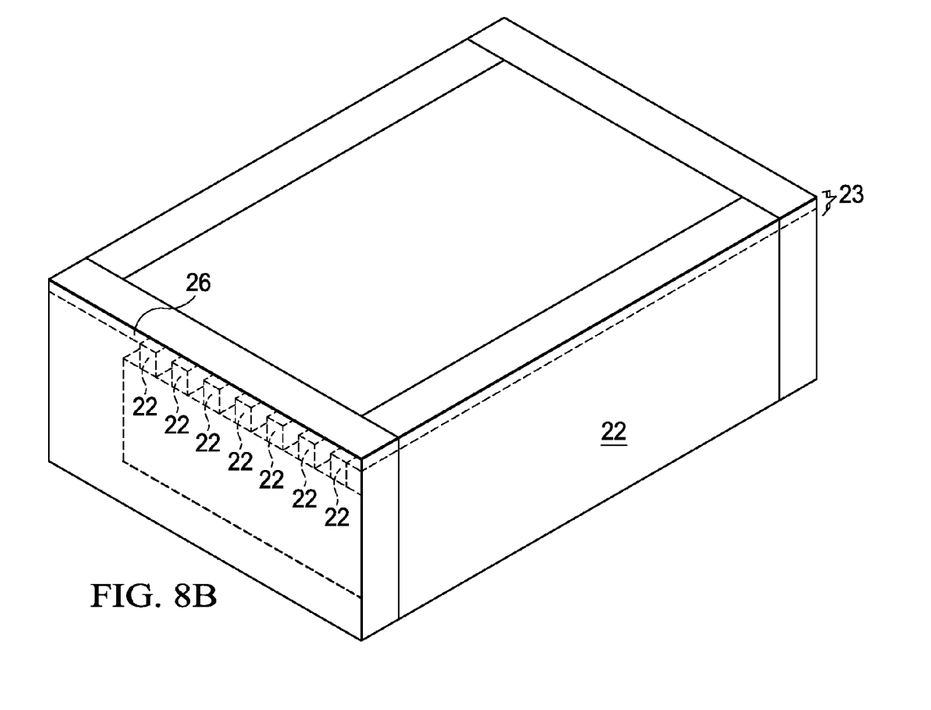

Referring to FIG. 7, the moment that adjacent (111) facets 26a touch each other, (100) planes 26b, which are horizontal planes, will be formed, and the resulting structure is shown in FIG. 7. The respective epitaxy growth step is referred to as the second epitaxial growth step hereinafter. In an embodiment, after semiconductor regions 26 touch each other, the same process conditions as used in the first epitaxial growth step are maintained, and (100) planes 26b are formed. The process conditions, however, may also be adjusted to ensure the growth of (100) planes 26b dominates the growth of semiconductor regions 26. It is observed that the growth of high-quality (111) facets 26a may affect the growth of (100) planes 26b. If no high-quality (111) facets 26a is formed, (100) planes 26b may not be formed, or may not dominate the epitaxial growth of semiconductor regions 26. Although (111) facets 26a may continue to grow after (111) facets 26a touch each other, due to the fact the growth rate on (100) planes is higher than that on (111) facets 26a, block semiconductor region 26 with flat surface 26c will be formed, as shown in FIGS. 8A and 8B, which are a top view and a perspective view, and illustrate that block semiconductor region 26 is formed inside region 25 that is defined by insulation region(s) 23.

An experiment was performed to form a pure germanium region 26 with a growth temperature equal to about 500° C., a partial pressure of germane equal to about 0.13 torrs, a flow rate of germane equal to about 9 sccm, a flow rate of hydrogen equal to about 50,000 sccm, and a total pressure of the growth chamber equal to 760 torrs. Under these process conditions, a large high-quality germanium layer having a top view area of 10 μm×10 μm, which layer is substantially free from threading dislocations, may be formed.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
  providing a semiconductor substrate comprising a first semiconductor material, wherein the first semiconductor material comprises silicon;
  forming a plurality of insulation regions over at least a portion of the semiconductor substrate, with a plurality of trenches separating the plurality of insulation regions apart from each other;
  performing a first epitaxial growth to epitaxially grow a plurality of semiconductor regions in the plurality of trenches, wherein (111) facets are formed and exposed during the step of the first epitaxial growth, wherein the plurality of semiconductor regions comprises germanium-containing regions;
  at a time the (111) facets of neighboring ones of the plurality of semiconductor regions touch each other, performing a second epitaxial growth to continue growing the plurality of semiconductor regions to form (100) planes between the neighboring ones of the plurality of semiconductor regions; and
  forming a dielectric region over portions of the plurality of insulation regions, wherein during the second epitaxial growth, portions of the plurality of semiconductor regions that are over top surfaces of the plurality of insulation regions are confined by the dielectric region.

2. The method of claim 1, wherein the first epitaxial growth and the second epitaxial growth are performed using same process conditions.

3. The method of claim 1, wherein the first epitaxial growth and the second epitaxial growth are performed using different process conditions.

4. The method of claim 1, wherein during an entirety of the first epitaxial growth, process conditions are substantially not changed.

5. The method of claim 1, wherein each of the plurality of trenches has an aspect ratio greater than about 1.73.

6. The method of claim 5, wherein the aspect ratio is greater than about 3.46.

7. The method of claim 1, wherein the plurality of semiconductor regions are formed of substantially pure germanium.

8. The method of claim 1, wherein germane partial pressures in the first epitaxial growth and the second epitaxial growth are lower than about 0.13 Torr.

9. The method of claim 1, wherein growth temperatures of the first epitaxial growth and the second epitaxial growth are between about 500° C. and about 650° C.

10. The method of claim 1, wherein from a time when top ends of the plurality of semiconductor regions are level with a top surface of the plurality of insulation regions to a time when the neighboring ones of the plurality of semiconductor regions touch each other, substantially none of the (100) planes are formed.

11. The method of claim 1, wherein the semiconductor substrate is a silicon substrate, and the plurality of semiconductor regions is silicon germanium regions or substantially pure germanium regions.

12. A method comprising:
  providing a silicon-containing semiconductor substrate;
  forming a plurality of insulation regions over at least a lower portion of the silicon-containing semiconductor substrate, with a plurality of trenches separating the plurality of insulation regions apart from each other; and
  performing an epitaxial growth to epitaxially grow a plurality of semiconductor regions from trenches, until the plurality of semiconductor regions merge with each other to form a bulk semiconductor region having a substantially flat top surface, wherein the plurality of semiconductor regions comprises germanium, and wherein the epitaxial growth comprises:
    a first epitaxial growth step ending at a time neighboring ones of the plurality of semiconductor regions touch each other, wherein process conditions for the first epitaxial growth step are configured to form (111) facets, with the (111) facets exposed on top ends of the plurality of semiconductor regions; and
    a second epitaxial growth step starting at the time the neighboring ones of the plurality of semiconductor regions touch each other, wherein process conditions for the second epitaxial growth step are configured to form (100) planes between and connecting the neighboring ones of the plurality of semiconductor regions.

13. The method of claim 12, wherein at the time the neighboring ones of the plurality of semiconductor regions touch each other, the (111) facets of the neighboring ones of the plurality of semiconductor regions touch each other.

14. The method of claim 13, wherein germane flow rates in the first and the second epitaxial growth steps are between about 2.5 sccm and about 10 sccm, and wherein hydrogen flow rates in the first and the second epitaxial growth steps are between about 50 slm and about 100 slm.

15. The method of claim 13, wherein growth temperatures in the first and the second epitaxial growth steps are between about 500° C. and about 650° C.

16. The method of claim 12, wherein the plurality of semiconductor regions is formed of substantially pure germanium.

17. The method of claim 12, wherein the plurality of semiconductor regions is silicon germanium regions or substantially pure germanium regions.

18. A method comprising:
providing a silicon substrate;
forming a plurality of insulation regions over the silicon substrate, with a plurality of trenches separating the plurality of insulation regions apart from each other, wherein the plurality of insulation regions have substantially uniform spacings;
forming an additional insulation region over portions of the plurality of insulation regions, wherein the additional insulation region encircles a combined region comprising first regions and second regions, wherein the first regions are directly over the plurality of insulation regions, and the second region are directly over the plurality of trenches;
performing an epitaxial growth to epitaxially grow a plurality of germanium regions from trenches, wherein substantially all of the surfaces of the plurality of germanium regions are formed of (111) facets; and
continuing the epitaxial growth after the (111) facets of the plurality of germanium regions touch each other until a block germanium region having a substantially flat top surface is formed in the region, wherein during the step of continuing the epitaxial growth, process conditions for growing the block germanium region are adjusted to form (100) planes.

19. The method of claim 18, wherein the plurality of trenches have uniform spacings.

20. The method of claim 18, wherein the plurality of trenches have aspect ratios greater than about 1.73.

* * * * *